US009559063B2

(12) United States Patent
Watanabe et al.

(10) Patent No.: US 9,559,063 B2
(45) Date of Patent: Jan. 31, 2017

(54) SEMICONDUCTOR DEVICE HAVING CRACK-RESISTING RING STRUCTURE AND MANUFACTURING METHOD THEREOF

(71) Applicant: Renesas Electronics Corporation, Kawasaki-shi, Kanagawa (JP)

(72) Inventors: Takeshi Watanabe, Kanagawa (JP); Junya Ishii, Kanagawa (JP); Hirofumi Saitou, Kanagawa (JP); Hiroyasu Kitajima, Kanagawa (JP); Tatsuki Kojima, Kanagawa (JP); Yoshitsugu Kawashima, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 68 days.

(21) Appl. No.: 13/946,015

(22) Filed: Jul. 19, 2013

(65) Prior Publication Data
US 2014/0027928 A1    Jan. 30, 2014

(30) Foreign Application Priority Data
Jul. 25, 2012    (JP) ................................. 2012-164984

(51) Int. Cl.
*H01L 23/00*    (2006.01)
*H01L 21/56*    (2006.01)
(Continued)

(52) U.S. Cl.
CPC ............ *H01L 23/562* (2013.01); *H01L 21/56* (2013.01); *H01L 23/585* (2013.01); *H01L 23/3192* (2013.01); *H01L 2924/0002* (2013.01)

(58) Field of Classification Search
CPC ....... H01L 23/562; H01L 21/56; H01L 23/585
(Continued)

(56) References Cited

U.S. PATENT DOCUMENTS 5,429,709 A  *  7/1995  Mizutani ............. H01L 21/4857
                                                      216/100
5,763,936 A  *  6/1998  Yamaha et al. ................ 257/644
(Continued)

FOREIGN PATENT DOCUMENTS

JP    2009-76782 A    4/2009

OTHER PUBLICATIONS

Official action dated Dec. 1, 2015 issued in Japanese counterpart application (No. 2012-164984) with translation.

*Primary Examiner* — Victoria K Hall
(74) *Attorney, Agent, or Firm* — Womble Carlyle

(57) ABSTRACT

A semiconductor device includes an interlayer insulating layer disposed over a semiconductor substrate, and including a plurality of wiring layers; a seal ring disposed in the interlayer insulating layer, and surrounding a circuit region of the semiconductor substrate; a crack lead ring disposed in the interlayer insulating layer, and surrounding the seal ring; and a protective film disposed over the interlayer insulating layer, and covering the crack lead ring and the seal ring. The crack lead ring includes an uppermost wiring layer in an uppermost layer of a plurality of wiring layers. When the crack lead ring has a wiring in an underlayer below the uppermost layer, the uppermost layer wiring extends towards the outside of the device, relative to the wiring in the underlayer. The protective film has an end overlapped with an end of the uppermost layer wiring to form a step over the interlayer insulating layer.

22 Claims, 12 Drawing Sheets

(51) Int. Cl.
*H01L 23/58* (2006.01)
*H01L 23/31* (2006.01)

(58) Field of Classification Search
USPC .......................................................... 257/620
See application file for complete search history.

(56) References Cited

U.S. PATENT DOCUMENTS

| | | | | |
|---|---|---|---|---|
| 6,261,883 B1* | 7/2001 | Koubuchi | ............ | G03F 9/7076 257/776 |
| 6,492,716 B1* | 12/2002 | Bothra | ................. | H01L 23/552 257/678 |
| 6,566,736 B1* | 5/2003 | Ogawa | ............... | H01L 23/3185 257/618 |
| 6,753,608 B2 | 6/2004 | Tomita | | |
| 7,138,700 B2 | 11/2006 | Tomita et al. | | |
| 7,211,897 B2 | 5/2007 | Yamanoue et al. | | |
| 7,339,256 B2* | 3/2008 | Nakamura et al. | ........... | 257/659 |
| 7,605,448 B2* | 10/2009 | Furusawa et al. | ............ | 257/620 |
| 7,821,104 B2* | 10/2010 | Lee et al. | ................. | 257/620 |
| 7,847,388 B2* | 12/2010 | Takahashi | .................... | 257/686 |
| 7,939,913 B2* | 5/2011 | Watanabe et al. | ........... | 257/620 |
| 8,810,001 B2* | 8/2014 | Hung et al. | .................. | 257/532 |
| 8,994,148 B2* | 3/2015 | Gratz et al. | ................... | 257/620 |
| 2002/0024115 A1* | 2/2002 | Ibnabdeljalil | ........ | H01L 23/562 257/620 |
| 2003/0216009 A1* | 11/2003 | Matsuura | ............. | H01L 23/544 438/460 |
| 2004/0026785 A1* | 2/2004 | Tomita | ................ | H01L 23/3171 257/758 |
| 2004/0150070 A1* | 8/2004 | Okada et al. | ................. | 257/508 |
| 2004/0192024 A1* | 9/2004 | Ito | ........................... | H01L 21/78 438/623 |
| 2004/0262768 A1* | 12/2004 | Cho | ................... | H01L 23/5258 257/758 |
| 2005/0023669 A1* | 2/2005 | Obinata | ............. | H01L 23/3114 257/690 |
| 2005/0026397 A1* | 2/2005 | Daubenspeck et al. | ...... | 438/465 |
| 2005/0040523 A1* | 2/2005 | Hanaoka | ................. | H01L 21/74 257/734 |
| 2005/0098893 A1* | 5/2005 | Tsutsue et al. | ............... | 257/758 |
| 2005/0161766 A1* | 7/2005 | Sato | ................... | H01L 23/3192 257/529 |
| 2005/0269702 A1* | 12/2005 | Otsuka | .......................... | 257/750 |
| 2005/0280120 A1* | 12/2005 | Tomita | .................. | H01L 23/522 257/620 |
| 2006/0012012 A1* | 1/2006 | Wang et al. | .................. | 257/620 |
| 2006/0065953 A1* | 3/2006 | Kim | .................... | H01L 23/3178 257/620 |
| 2006/0267154 A1* | 11/2006 | Pitts et al. | ..................... | 257/620 |
| 2006/0289997 A1* | 12/2006 | Tomita | ................ | H01L 23/5329 257/758 |
| 2007/0090447 A1* | 4/2007 | Morimoto et al. | ........... | 257/316 |
| 2007/0158788 A1* | 7/2007 | Yang | ................... | H01L 23/3192 257/620 |
| 2008/0042292 A1* | 2/2008 | Adkisson et al. | ............. | 257/773 |
| 2008/0093704 A1* | 4/2008 | Park | ..................... | H01L 23/564 257/529 |
| 2008/0093708 A1* | 4/2008 | Noma et al. | .................. | 257/620 |
| 2008/0122038 A1* | 5/2008 | Inohara | ........................ | 257/620 |
| 2008/0128892 A1* | 6/2008 | Wu | ..................... | H01L 23/522 257/700 |
| 2008/0157284 A1* | 7/2008 | Chang et al. | ................. | 257/620 |
| 2008/0185685 A1* | 8/2008 | Nakashiba | .................... | 257/535 |
| 2008/0191205 A1* | 8/2008 | Tsai et al. | ....................... | 257/48 |
| 2008/0230874 A1* | 9/2008 | Yamada et al. | .................. | 257/620 |
| 2008/0258266 A1* | 10/2008 | Takemura et al. | ............. | 257/620 |
| 2008/0283969 A1* | 11/2008 | Jeng et al. | ..................... | 257/620 |
| 2008/0290469 A1* | 11/2008 | Grivna | .................. | H01L 23/585 257/620 |
| 2008/0299708 A1* | 12/2008 | Tsutsue | ........................ | 438/121 |
| 2009/0014882 A1* | 1/2009 | Ito | ..................... | H01L 23/53238 257/758 |
| 2009/0108409 A1* | 4/2009 | Tsutsue | ................. | H01L 21/768 257/618 |
| 2009/0108410 A1* | 4/2009 | Takemura et al. | ............. | 257/620 |
| 2009/0115024 A1* | 5/2009 | Jeng et al. | ..................... | 257/620 |
| 2009/0121321 A1* | 5/2009 | Miccoli | ............... | G03F 7/70625 257/618 |
| 2009/0174011 A1* | 7/2009 | Jeon et al. | ..................... | 257/409 |
| 2009/0184424 A1* | 7/2009 | Furusawa | ............... | H01L 22/32 257/758 |
| 2009/0250783 A1* | 10/2009 | Nakashiba | ..................... | 257/508 |
| 2009/0294912 A1* | 12/2009 | Chibahara | ............... | H01L 23/02 257/620 |
| 2009/0321890 A1* | 12/2009 | Jeng et al. | ..................... | 257/620 |
| 2010/0072578 A1* | 3/2010 | Kunishima | ..................... | 257/620 |
| 2010/0078769 A1* | 4/2010 | West et al. | ..................... | 257/620 |
| 2010/0123219 A1* | 5/2010 | Chen et al. | ..................... | 257/620 |
| 2010/0181650 A1* | 7/2010 | Shigihara et al. | ............. | 257/620 |
| 2010/0200960 A1* | 8/2010 | Angyal et al. | ................. | 257/620 |
| 2010/0244199 A1* | 9/2010 | Sakuma et al. | ................. | 257/618 |
| 2011/0156263 A1* | 6/2011 | Eto | ........................ | H01L 23/585 257/773 |
| 2011/0233735 A1* | 9/2011 | Yoshizawa | ............ | H01L 23/585 257/620 |
| 2011/0241178 A1* | 10/2011 | Miki | .................... | H01L 21/6836 257/620 |
| 2011/0278722 A1* | 11/2011 | Miki | ..................... | 257/737 |
| 2011/0309465 A1* | 12/2011 | Chen et al. | ..................... | 257/503 |
| 2012/0007178 A1* | 1/2012 | Oota | .................... | H01L 23/562 257/334 |
| 2012/0007211 A1* | 1/2012 | Aleksov | .................. | H01L 22/32 257/508 |
| 2012/0104541 A1* | 5/2012 | Chiu | .................... | H01L 23/10 257/508 |
| 2012/0104594 A1* | 5/2012 | Chen et al. | ..................... | 257/737 |
| 2012/0175728 A1* | 7/2012 | Yang et al. | ..................... | 257/508 |
| 2012/0241914 A1* | 9/2012 | Yook et al. | ..................... | 257/620 |
| 2012/0241917 A1* | 9/2012 | Ide | ........................ | H01L 23/481 257/622 |
| 2012/0313094 A1* | 12/2012 | Kato | ........................ | H01L 22/34 257/48 |
| 2012/0326146 A1* | 12/2012 | Hui et al. | ......................... | 257/48 |
| 2013/0001787 A1* | 1/2013 | Yoshizawa | ............ | H01L 23/564 257/762 |
| 2013/0023091 A1* | 1/2013 | Leal et al. | ..................... | 438/132 |
| 2013/0043566 A1* | 2/2013 | Nakano | ............... | H01L 23/3192 257/620 |
| 2013/0109153 A1* | 5/2013 | Yaung et al. | .................. | 438/454 |
| 2013/0192078 A1* | 8/2013 | Yoshimi | ................. | H01L 22/12 33/701 |
| 2014/0077320 A1* | 3/2014 | Chen et al. | ..................... | 257/431 |
| 2014/0077383 A1* | 3/2014 | Daubenspeck | ....... | H01L 23/585 257/774 |
| 2014/0239455 A1* | 8/2014 | Ishii | ............................ | 257/620 |
| 2014/0264745 A1* | 9/2014 | Yen | ...................... | H01L 23/552 257/532 |
| 2015/0091161 A1* | 4/2015 | Tomita | .......................... | 257/737 |
| 2016/0244326 A1* | 8/2016 | Bretthauer | .......... | B81C 1/00825 |

* cited by examiner

SEMICONDUCTOR DEVICE HAVING CRACK-RESISTING RING STRUCTURE AND MANUFACTURING METHOD THEREOF

CROSS-REFERENCE TO RELATED APPLICATIONS

The disclosure of Japanese Patent Application No. 2012-164984 filed on Jul. 25, 2012 including the specification, drawings and abstract is incorporated herein by reference in its entirety.

BACKGROUND

The present invention relates to a semiconductor device, and more particularly to a technique suitable for use in a semiconductor device into which, for example, a semiconductor wafer is diced.

In a manufacturing process of the semiconductor device, a plurality of semiconductor devices are formed over the semiconductor wafer. Thereafter, the semiconductor wafer is diced to separate the individual semiconductor devices as semiconductor chips. In this situation, a crack may be generated in an end (scribe line region) of each semiconductor chip by dicing, and spread into a circuit region within the semiconductor chip. As a technique for preventing the spread of the crack, a seal ring (or a guard ring) is known in the prior art. The seal ring is formed of a metal member stacked to penetrate through a plurality of inter-layer insulating films disposed over a semiconductor substrate. The seal ring is annularly disposed to surround the circuit region.

For example, Japanese Unexamined Patent Application Publication No. 2004-304124 (US2004/0195582(A1)) discloses a semiconductor device. The semiconductor device has a circuit formation region which is a region of a circuit formed over the semiconductor substrate. The semiconductor device includes a first guard ring, a second guard ring, and a first connection portion. In order to prevent moisture from entering the circuit formation region from a periphery thereof, the first guard ring surrounds the periphery of the circuit formation region. The second guard ring is disposed between the circuit formation region and the first guard ring, and surrounds the periphery of the circuit formation region. The first connection portion connects the first guard ring and the second guard ring, and divides a region between the first guard ring and the second guard ring into a plurality of sections. In this technique, in order to prevent the entry of moisture, the seal ring that surrounds the circuit formation region is as least doubled, and the respective seal rings are connected to each other. With this configuration, moisture is prevented from entering the circuit formation region, and a crack generated at the time of dicing is prevented from spreading into the circuit formation region.

Also, Japanese Unexamined Patent Application Publication No. 2004-153015 (US2004/0084777(A1)) discloses a semiconductor device and a manufacturing method thereof. The semiconductor device includes a first insulating film, a second insulating film, a wiring structure, a first dummy pattern, and a second dummy pattern. The first insulating film is formed over the semiconductor substrate. The second insulating film is formed over the first insulating film. The wiring structure is embedded in the first insulating film and the second insulating film. The first dummy pattern is formed of a first conductive layer embedded in at least a surface side of the first insulating film in the vicinity of the wiring structure. The second dummy pattern is formed of a second conductive layer embedded in the second insulating film in the vicinity of the wiring structure, and connected to the first dummy pattern through a via hole portion. In this technique, an interlayer insulating film disposed in the vicinity of the wiring structure (guard ring) is reinforced by the dummy patterns to prevent a crack or separation from being generated on an interface or in an interior of the interlayer insulating film.

SUMMARY

The seal rings (or the guard rings) prevent a crack generated at the time of dicing from spreading into the circuit region within the semiconductor chip. However, the presence of seal rings for preventing the crack from spreading is not enough. That is, the crack generated at the time of dicing may destroy the seal rings, and spread into the circuit region, or may spread into the circuit region through the semiconductor substrate disposed below the seal rings. The crack and the moisture entering through the crack induce leakage and disconnection between the wirings, and fatally damage the semiconductor device. In the semiconductor device, a technique is desirable in which the crack caused by a mechanical stress at the time of dicing can be further prevented from spreading into the circuit region.

The other problems and novel features will become apparent from the description of the present invention and the attached drawings.

According to an aspect of the present invention, there is provided a semiconductor device including a seal ring annularly disposed outside a circuit region of a semiconductor substrate, a wiring of an uppermost layer annularly disposed further outside the seal ring, and a protective film that covers the seal ring and the wiring layer. The wiring of the uppermost layer and the protective film overlap with each other at an end of an outside (side opposite to the circuit region) to form a step.

According to the aspect of the present invention, the crack caused by the mechanical stress at the time of dicing can be further prevented from spreading into the circuit region.

DETAILED DESCRIPTION

Hereinafter, embodiments of a semiconductor device and a manufacturing method of the semiconductor device will be described with reference to the accompanying drawings.

A configuration of the semiconductor device according to this embodiment will be described.

Figure 1A:
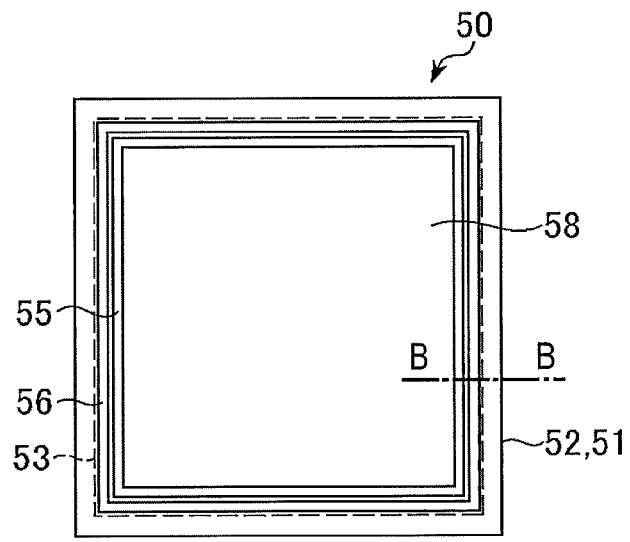
FIG. 1A is a schematic plan view illustrating a configuration of a semiconductor device according to an embodiment.
Figure 1B:
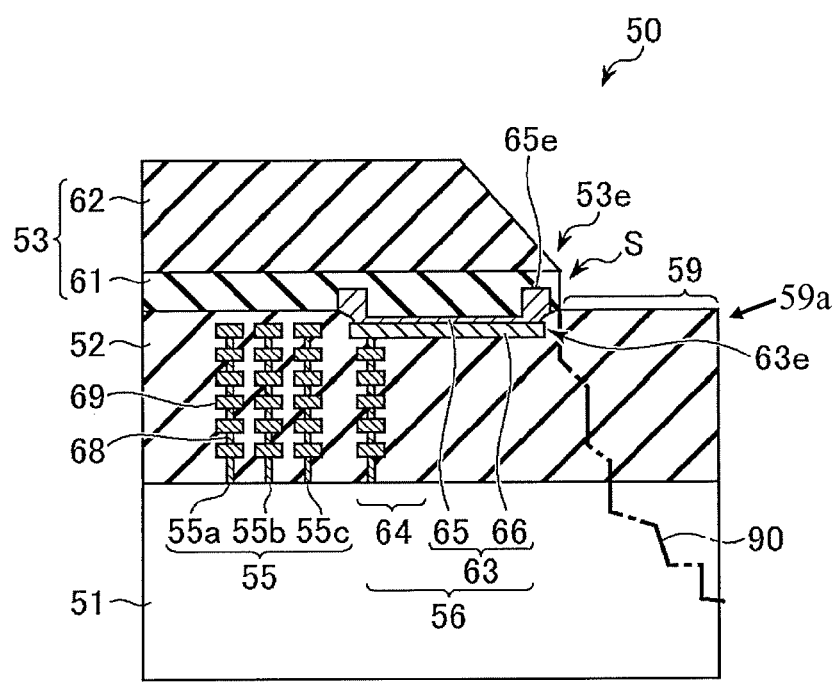
FIG. 1B is a schematic cross-sectional view illustrating the configuration of the semiconductor device according to the embodiment along the line B-B in FIG. 1A.

FIGS. 1A and 1B are a schematic plan view and a schematic cross-sectional view illustrating the configuration of the semiconductor device according to this embodiment, respectively. FIG. 1A is a schematic plan view of the entire semiconductor device, and FIG. 1B is a schematic cross-sectional view taken along a line B-B in FIG. 1A. A semiconductor device 50 is a semiconductor chip diced from a semiconductor wafer. Therefore, there is a possibility that a crack caused by dicing is present in a scribe line region 59 of an outer peripheral portion thereof. The semiconductor device 50 includes an interlayer insulating layer 52, seal rings 55, a crack lead ring 56, and a protective film 53. In the figure, in order to exhibit the effect of this embodiment, a crack 90 capable of being generated is virtually illustrated.

The interlayer insulating layer 52 is disposed over a semiconductor substrate 51, and includes a plurality of wiring layers. The plurality of wiring layers will be described later. The seal rings 55 are disposed in the interlayer insulating layer 52, and surround a circuit region 58 of the semiconductor substrate 51. The crack lead ring 56 is disposed in the interlayer insulating layer 52, and surrounds the seal rings 55. The crack lead ring 56 includes an uppermost layer wiring 63 in the uppermost layer among the plurality of wiring layers. When the crack lead ring 56 has a wiring in an underlayer below the uppermost layer, the uppermost layer wiring 63 extends towards the outside 59a of the device (i.e., towards the scribe line region 59), relative to the wiring in the underlayer. The protective film 53 has an end 53e which overlaps an end 63e of the uppermost layer wiring 63 but does not overlap the scribe line region 59 to form a step S over the interlayer insulating layer 52 at an edge of the scribe line region 59. The crack lead ring 56 may have no wiring in the underlayer, as will be described later with respect to FIG. 15.

In this embodiment, the protective film 53 is formed in such a manner that the end 53e of the protective film 53 overlaps the end 63e of the uppermost layer wiring 63 of the crack lead ring 56. With this configuration, the step S can be formed over the interlayer insulating layer 52 in a portion where the end 63e of the uppermost layer wiring 63 overlaps the end 53e of the protective film 53. With the formation of the above-mentioned step S, it is conceivable that the interlayer insulating layer 52 around the step S (also the semiconductor substrate 51 according to the circumstances) can be strained. As a result, the crack 90 generated in the scribe line region 59 at the time of dicing can propagate to the vicinity of the step S by an influence of the strain, where it appears. As a result, the crack 90 can be prevented from spreading into the circuit region 58 of the semiconductor device 50. This makes it possible to prevent defects in the semiconductor device 50 from being generated.

In this example, if the crack lead ring 56 has the wiring m the wiring layer lower than has an uppermost layer wiring 63 comprising an upper wiring 65 and a lower wiring 66, the uppermost layer wiring 63 excluding protrusion 65e extends farther toward the outside in the lower wiring 66 than in the upper wiring 65. That is, the uppermost layer wiring 63 is projected toward the scribe line region 59 side from the wiring in the wiring layer lower than the uppermost layer wiring 63. Alternatively, the crack lead ring 56 may have no wiring in the wiring layer lower than the uppermost layer. With the above configuration, a position of the step S to which the crack 90 is directed can be distanced from the seal rings 55, thereby making it difficult to spread the crack 90 toward the seal rings 55. In addition, it is conceivable that the scribe line region 59 side below the crack lead ring 56 is formed into a region in which no wiring is formed, as a result of which the interlayer insulating layer 52 around the step S can be further strained.

Hereinafter, the interlayer insulating layer 52, the seal rings 55, the crack lead ring 56, and the protective film 53 of the semiconductor device 50 will be further described.

The interlayer insulating layer 52 includes a plurality of stacked insulating films (not explicitly shown). The interlayer insulating layer 52 also includes a plurality of wiring layers. The respective insulating layers isolate the wirings of the wiring layers from each other. A portion of the interlayer insulating layer 52 which is not covered with the protective film 53 is a part of the scribe line region 59. The semiconductor device 50 is diced along the scribe line region 59. The interlayer insulating layer 52 is exemplified by a silicon oxide film ($SiO_2$ film), a silicon nitride film (SiNx film), a silicon oxynitride film (SiON film), a silicon carbonitride film (SiCN film), and a low-permittivity film (SiOF). Each wiring layer includes wirings 69 and via holes 68 that connect the wirings 69 of the upper and lower wiring layers. The wirings 69 and the via holes 68 are used for signal wirings and the power wirings in the circuit region 58. Also, the wirings 69 and the via holes 68 are also used as members configuring the seal rings 55 and the crack lead ring 56, as will be described later.

The seal rings 55 prevent the crack 90 generated at the time of dicing from spreading into the circuit region 58 of the crack 90, and prevent moisture from entering the circuit region 58 through the crack 90. More specifically, in the seal rings 55, the annular via holes 68 and the annular wirings 69 are alternately continuously stacked on each other from the lowermost wiring layer to the uppermost wiring layer within the interlayer insulating layer 52. In other words, the seal rings 55 are structured so that the annular via holes 68 and the annular wirings 69, which are alternately continuously stacked on the semiconductor substrate 51, are integrated together, and surround the circuit region 58 in a wall configuration. The seal rings 55 can be made of the same material as that of the via holes and the wirings. The seal rings 55 are each exemplified by a laminated film of a barrier film where a tantalum nitride film (TaN film) and a tantalum film (Ta film) are stacked on each other, and a copper film (Cu film).

The number of seal rings 55 may be one, or plural from the circuit region 58 side toward the outside (scribe line region 59 side). In an example of FIG. 1B, the number of seal rings 55 is three seal rings 55a, 55b, and 55c. That is, the seal rings 55 surround the circuit region 58 thrice in a concentric arrangement. In this example, when the plurality of seal rings 55 are provided, it is preferable that a first distance from the outermost seal ring 55 adjacent to the crack lead ring 56 to the crack lead ring 56 is larger than a second distance from the outermost seal ring 55 to an adjacent seal ring 55. In the example of FIG. 1B, a distance of the seal ring 55c from the adjacent crack lead ring 56 is larger than a distance between seal ring 55c and another adjacent seal ring 55b. With the above configuration, the position of the step S that guides the crack 90 is sufficiently distanced from the seal rings 55, so as to make it difficult for the crack 90 to spread toward the seal rings 55.

The crack lead ring 56 and the protective film 53 together help define the Step S. It is conceivable that the crack lead ring 56 and the protective film 53 together help direct the crack 90 generated at the time of dicing to the step S. With this configuration, the crack lead ring 56 prevents the crack 90 from spreading into the circuit region 58 of the device 50, and prevents moisture from entering the circuit region 58 through the crack 90. The crack lead ring 56 is annularly disposed to surround the seal rings 55, as seen in FIG. 1A. More specifically, the crack lead ring 56 includes at least the uppermost layer wiring 63, and may further include a guard ring 64 as a wiring provided in a layer lower than the uppermost layer wiring 63.

The uppermost layer wiring 63 is disposed in the uppermost wiring layer among the plurality of wiring layers. The uppermost layer wiring 63 is an annular wiring that surrounds the seal rings 55 in the uppermost wiring layer. If the crack lead ring 56 has a wiring (in an example, guard ring 64) in a wiring layer lower than the uppermost layer, the uppermost layer wiring 63 extends toward the outside (i.e., towards the scribe line region 59) from such wiring. In other words, a first width of the uppermost layer wiring 63 is broader than a second width of the wiring (in an example, guard ring 64) of the wiring layer lower than the uppermost layer wiring 63. As the first width is broader, the step S is more distanced from the seal rings 55, and a region in which there is no wiring is spread below the uppermost layer wiring 63. Therefore, the effect of preventing the crack 90 from spreading toward the circuit region 58 is enhanced as described above.

In the example of FIG. 1B, the crack lead ring 56 has the guard ring 64 on a side lower than the uppermost layer. For that reason, the uppermost layer wiring 63 extends toward the scribe line region 59 side from the guard ring 64, which is lower than the uppermost layer wiring 63. That is, an end of the uppermost layer wiring 63 on the scribe line region 59 side extends toward the scribe line region 59 side from the end of the guard ring 64. As a result, the effect of preventing the crack 90 from spreading toward the circuit region 58 as described above can be obtained.

It is preferable that the width of the uppermost layer wiring 63 which extends toward the scribe line region 59 side from the end of the wiring (in an example, guard ring 64) of the wiring layer lower than the uppermost layer wiring 63 is equal to or larger than the width of one guard ring 64 (or one seal ring 55). This helps prevent the crack 90 from spreading toward the circuit region 58 as described above. In that case, it is preferable that the width of the uppermost layer wiring 63 is set to be larger than the width defined by two outermost adjacent rings, be they guard rings 64 or seal rings 55. With the above configuration, the uppermost layer wiring 63 can be extended (protruded) toward the scribe line region 59 side more than one width of the guard ring 64 (or the seal ring 55) depending on a position of the guard ring 64. As a result, the effect of preventing the crack 90 from spreading toward the circuit region 58 as described above is more enhanced.

In the example of FIG. 1B, the width of the uppermost layer wiring 63 is substantially equal to the width defined by about five adjacent guard rings 64 or seal rings 55. Also, the position of the guard ring 64 is located at an outer end of the circuit region 58 side. Accordingly, the uppermost layer wiring 63 is extended (protruded) toward the scribe line region 59 side by at least the width defined by four guard rings 64 or seal rings 55, one guard ring 64 being directly below the uppermost layer wiring 63 on the latter's circuit region 58 side, as seen in FIG. 1B. As a result, the effect of preventing the crack 90 from spreading toward the circuit region 58 as described above can be obtained.

The guard ring 64 is a wiring continuously formed over one or more wiring layers 69 through interconnecting via holes 68. More specifically, in the guard ring 64, the annular via holes 68 and the annular wirings 69 are alternately continuously stacked on each other from the wiring layer of the lowermost layer to one wiring layer below the uppermost layer within the interlayer insulating layer 52. In other words, the guard ring 64 has a structure in which the annular via holes 68 and the annular wirings 69 are alternately stacked on the semiconductor substrate 51, and integrated into a wall. An upper portion of the guard ring 64 is coupled with the uppermost layer wiring 63. Accordingly, the guard ring 64, together with the uppermost layer wiring 63, has the same function as that of at least the seal rings 55.

It is preferable that the guard ring 64 is disposed closer to the seal rings 55 than to an intermediate position, in a width direction, of the uppermost layer wiring 63. That is, it is preferable that the outer ring 64 is proximate to the circuit region 58 side and remote from the end of the uppermost layer wiring 63 (the end of the uppermost layer wiring 63 extends toward the scribe line region 59). With this configuration, when the end 63e of the uppermost layer wiring 63 and the end 53e of the protective film 53 overlap with each other to provide the step S, the guard ring 64 can be distanced from the step S. It is more preferable that the guard ring 64 is disposed closest to the circuit region 58 side in the width direction of the uppermost layer wiring 63. With the above shape, when the crack 90 extends to the vicinity of the step S, even if the crack 90 spreads toward the circuit region 58 in error, the crack propagation can be prevented. Also, it is conceivable that when a lateral side (lower side of the uppermost layer wiring 63) of the guard ring 64 is set in a region where no wiring is provided, the interlayer insulating layer 52 in the periphery of the step S can be further strained. As a result, with an influence of this strain, the crack 90 generated in the scribe line region 59 at the time of dicing can be further led to the vicinity of the step S, rather than to the circuit region 58.

The uppermost layer wiring 63 includes a lower wiring 66 and an upper wiring 65. The lower wiring 66 has substantially the same thickness as that of the wirings 69 of the wiring layers of the seal rings 55 and the circuit region 58. The upper wiring 65 is disposed over the lower wiring 66. The upper wiring 65 has substantially the same thickness as that of a pad region (not shown) of the circuit region 58. The upper wiring 65 has an upper surface exposed to the surface of the interlayer insulating layer 52, and covered with the protective film 53. The upper wiring 65 has a protrusion 65e which is an end protruded upward from the upper surface of the interlayer insulating layer 52. In this case, it is conceivable that the interlayer insulating layer 52 (also the semiconductor substrate 51 as occasion demands) can be further strained in the vicinity of the step S where the protrusion 65e (end) of the uppermost layer wiring 63 and the end 53e of the protective film 53 overlap with each other. As a result, it is conceivable that with an influence of the strain, the crack 90 can be further led to the vicinity of the step S.

The guard ring 64 and the uppermost layer wiring 63 can be made of the same material as that of the via holes 68 and the wirings 69 as with the seal rings 55. That is, the guard ring 64 is exemplified by a laminated film of a barrier film where a tantalum nitride film (TaN film) and a tantalum film (Ta film) are stacked on each other, and a copper film (Cu film). Alternatively, the guard ring 64 is exemplified by a laminated film of a lower barrier film, a copper added aluminum film (AlCu film), and an upper barrier film. The lower barrier film is exemplified by a laminated film of a titanium film (Ti) and a titanium nitride film (TiN film), and the upper barrier film is exemplified by the titanium nitride film (TiN film).

The protective film 53 protects a region of the semiconductor device 50 except for an (aluminum) pad region (not shown) and the scribe line region 59. The protective film 53 is disposed over the interlayer insulating layer 52 to cover at least the crack lead ring 56 and the seal rings 55. The protective film end 53e overlaps with the end 63e of the uppermost layer wiring 63. The protective film 53 includes a passivation film 61 and a heat resistant protective film 62. The passivation film 61 is disposed over the interlayer insulating layer 52 to cover the crack lead ring 56 and the seal rings 55. An end of the passivation film 61 overlaps with the end 63e of the uppermost layer wiring 63. The heat resistant protective film 62 is disposed to cover the passivation film 61. An end of the heat resistant protective film 62 substantially coincides with the end of the passivation film 61, and overlaps with the end 63e of the uppermost layer wiring 63. That is, the end of the heat resistant protective film 62, the end of the passivation film 61, and the end 63e of the uppermost layer wiring 63 overlap with each other form the step S. The passivation film 61 is exemplified by a silicon nitride film (SiN film) or a silicon oxynitride film (SiON film). The heat resistant protective film 62 is exemplified by a heat resistant resin such as photosensitive polyimide.

In this embodiment, the end of the passivation film 61 (and the heat resistant protective film 62) is disposed in the vicinity of the end 63e of the uppermost layer wiring 63. With this configuration, the step S having the structure in which the end 63e of the uppermost layer wiring 63 and the end of the passivation film 61 (and the heat resistant protective film 62) overlap with each other can be formed over the interlayer insulating layer 52. It is conceivable that with the formation of the step S having the above structure, the interlayer insulating layer 52 around the step S can be strained (also in the semiconductor substrate 51 as occasion demands). As a result, with an influence of the strain, the crack 90 generated at the time of dicing and entering the interlayer insulating layer 52 can propagate to the vicinity of the step S, where it opens. As a result, the crack 90 can be prevented from spreading into the circuit region 58 of the semiconductor device 50. Also, the upper wiring 65 includes the protrusion 65e protruded upward from the upper surface of the interlayer insulating layer 52. It is conceivable that the above configuration can further strain the interlayer insulating layer 52 in the vicinity of the step S where the end 63e (protrusion 65e) of the uppermost layer wiring 63 and the end of the passivation film 61 (and the heat resistant protective film 62) overlap. As a result, it is conceivable that with the influence of the strain, the crack 90 that has entered the interlayer insulating layer 52 can then propagate to the vicinity of the step S. This makes it possible to prevent the defective of the semiconductor device 50 from being generated.

Next, a method of manufacturing the semiconductor device according to the first embodiment will be described.

Figure 2:
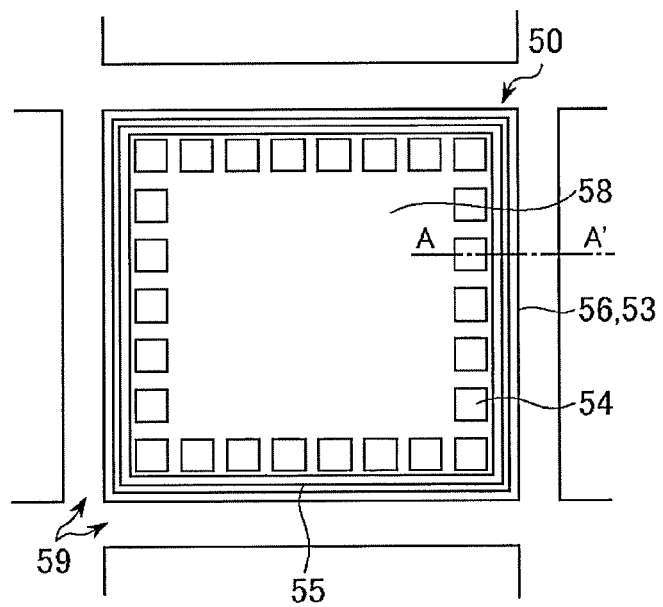
FIG. 2 is a schematic plan view of the semiconductor device manufactured in a method of manufacturing the semiconductor device according to the embodiment.

FIG. 2 is a schematic plan view of the semiconductor device manufactured in the method of manufacturing the semiconductor device according to this embodiment. FIGS. 3 to 11 are schematic cross-sectional views illustrating intermediate products and associated processes in the method of manufacturing the semiconductor device according to this embodiment. FIGS. 3 to 11 are cross-sectional views taken along a line A-A' in FIG. 2.

As illustrated in FIG. 2, a plurality of the semiconductor devices 50 are manufactured on the semiconductor wafer. The plurality of semiconductor devices 50 are diced along the scribe line region 59. In each of the semiconductor devices 50, the annular crack lead ring 56 and the annular seal rings 55 are arrayed from an outer peripheral side toward the circuit region 58 side in the stated order. A plurality of pads 54 is disposed along the seal rings 55 inside the seal rings 55. Hereinafter, an example of the method of manufacturing this structure will be described with reference to FIGS. 3 to 11.

Figure 3:
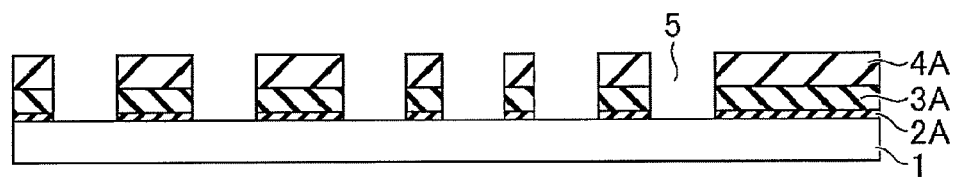
FIG. 3 is a schematic cross-sectional view illustrating respective processes in a method of manufacturing the semiconductor device according to the embodiment.

First, as illustrated in FIG. 3, an insulating film 2A about 5 nm in thickness, which is formed of, for example, a silicon carbonitride film (SiCN film), is deposited, for example, over a silicon substrate 1 which is a semiconductor wafer. Then, an insulating film 3A having a thickness of 10 nm which is formed of, for example, a low-permittivity film (SiOF film) is deposited over the insulating film 2A. Subsequently, an insulating film 4A having a thickness of 10 nm which is formed of, for example, a silicon oxide film (SiO$_2$ film) is deposited over the insulating film 3A. Thereafter, a resist mask (not shown) having a wiring groove pattern is formed over the insulating film 4A. Then, the insulating films 2A, 3A, and 4A are partially etched with the use of the resist mask through a dry etching technique to form wring grooves 5.

Figure 4:
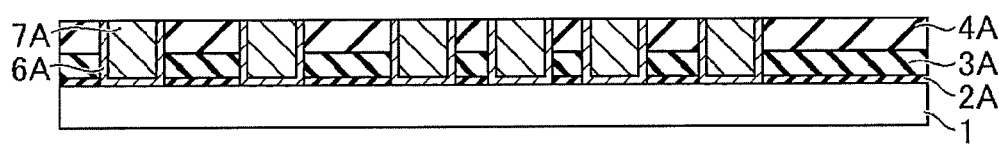
FIG. 4 is a schematic cross-sectional view illustrating respective processes in a method of manufacturing the semiconductor device according to the embodiment.

Subsequently, as illustrated in FIG. 4, a multilayer film 6A and, for example, a copper film 7A are sequentially deposited over the insulating film 4A in which the wiring grooves 5 are formed (not shown). The multilayer film 6A may comprise a tantalum nitride film (TaN film) and a tantalum film (Ta film) stacked on each other. Sequentially, portions of the multilayer film 6A and the copper film 7A which protrude from the wiring grooves 5 are removed through, for example, a CMP (chemical mechanical polishing) technique. At the same time, a surface of the copper film 7A embedded in the wiring grooves 5 through the CMP technique is flattened. As a result, a copper wiring (first layer (lowermost layer) wiring) 7A (including the via holes) coated with the multilayer film 6A is formed.

Figure 5:
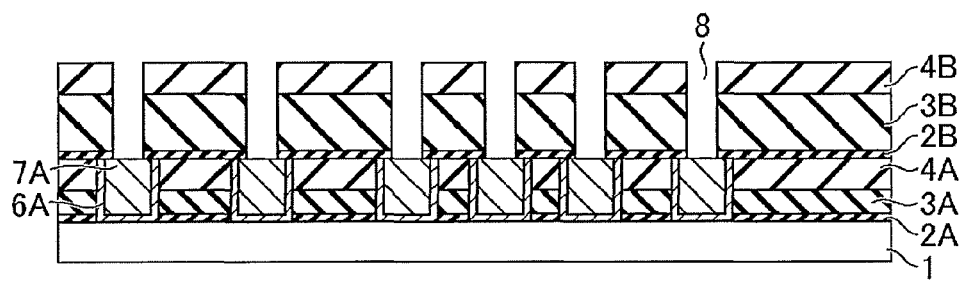
FIG. 5 is a schematic cross-sectional view illustrating the respective processes in the method of manufacturing the semiconductor device according to the embodiment.

Subsequently, as illustrated in FIG. 5, an insulating film 2B having a thickness of about 5 nm, which is formed of, for example, a silicon carbonitride film (SiCN film), is deposited over the copper film 7A. Then, an insulating film 3B having a thickness of about 25 nm, which is formed of, for example, a low-permittivity film (SiOF), is deposited over the insulating film 2B. Subsequently, an insulating film 4B having a thickness of about 25 nm, which is formed of, for example, a silicon oxide film (SiO$_2$ film), is deposited over the insulating film 3B. Thereafter, after an organic antireflection film (not shown) has been coated on a surface of the insulating film 4B, a resist mask (not shown) having a hole pattern is formed over the organic antireflection film through a photolithography. Then, the insulating films 2B, 3B, and 4B are partially etched with the use of the resist film through the dry etching technique. As a result, via holes 8 are formed. Thereafter, the resist mask and the organic antireflection film are removed by ashing.

Figure 6:
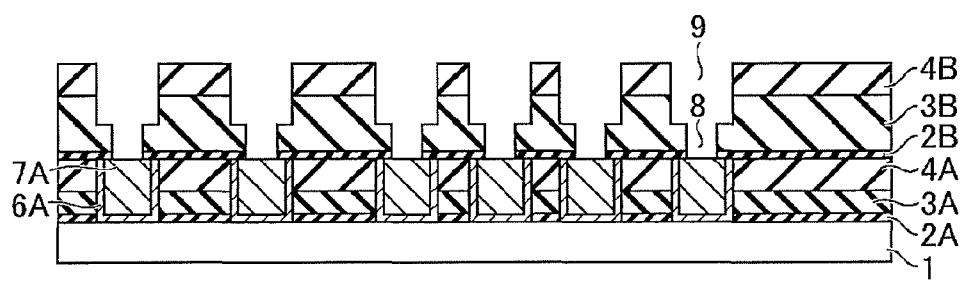
FIG. 6 is a schematic cross-sectional view illustrating the respective processes in the method of manufacturing the semiconductor device according to the embodiment.

Then, as illustrated in FIG. 6, a resist mask (not shown) having a wiring groove pattern is formed over the insulating film 4B through the photolithography. Then, the insulating films 3B and 4B are partially etched with the use of the resist mask through the dry etching technique to form wiring grooves 9 connected to the via holes 8.

Figure 7:
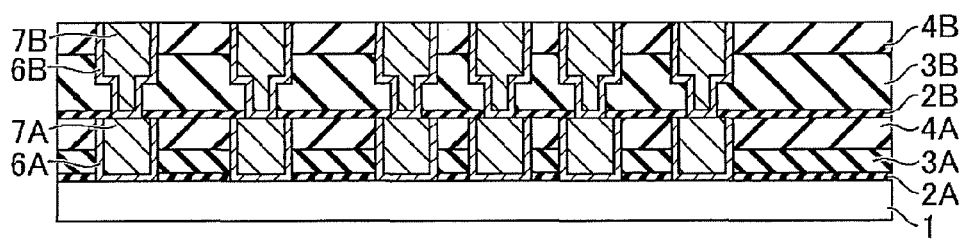
FIG. 7 is a schematic cross-sectional view illustrating the respective processes in the method of manufacturing the semiconductor device according to the embodiment.

Then, as illustrated in FIG. 7, a multilayer film 6B where, for example, a tantalum nitride film (TaN film) and a tantalum film (Ta film) are stacked on each other, and, for example, a copper film (Cu film) 7B are sequentially deposited over the insulating film 4B in which the via holes 8 and the wiring grooves 9 are formed (not shown). Sequentially, portions of the multilayer film 6B and the copper film 7B protruded from the wiring grooves 9 are removed through, for example, the CMP technique. At the same time, a surface of the copper film 7B embedded in the wiring grooves 9 through the CMP technique is flattened. As a result, a copper wiring (second layer wiring) 7B (including the via holes) coated with the multilayer film 6B is formed.

Thereafter, the processes described in FIGS. 5 to 7 are repeated to form a multilayer wiring structure (not shown). In this embodiment, a seven-layer (2A, 3A, 4A/6A, 7A) to (2G, 3G, 4G/6G, 7G) structure is used as the multilayer wiring structure.

Figure 8:
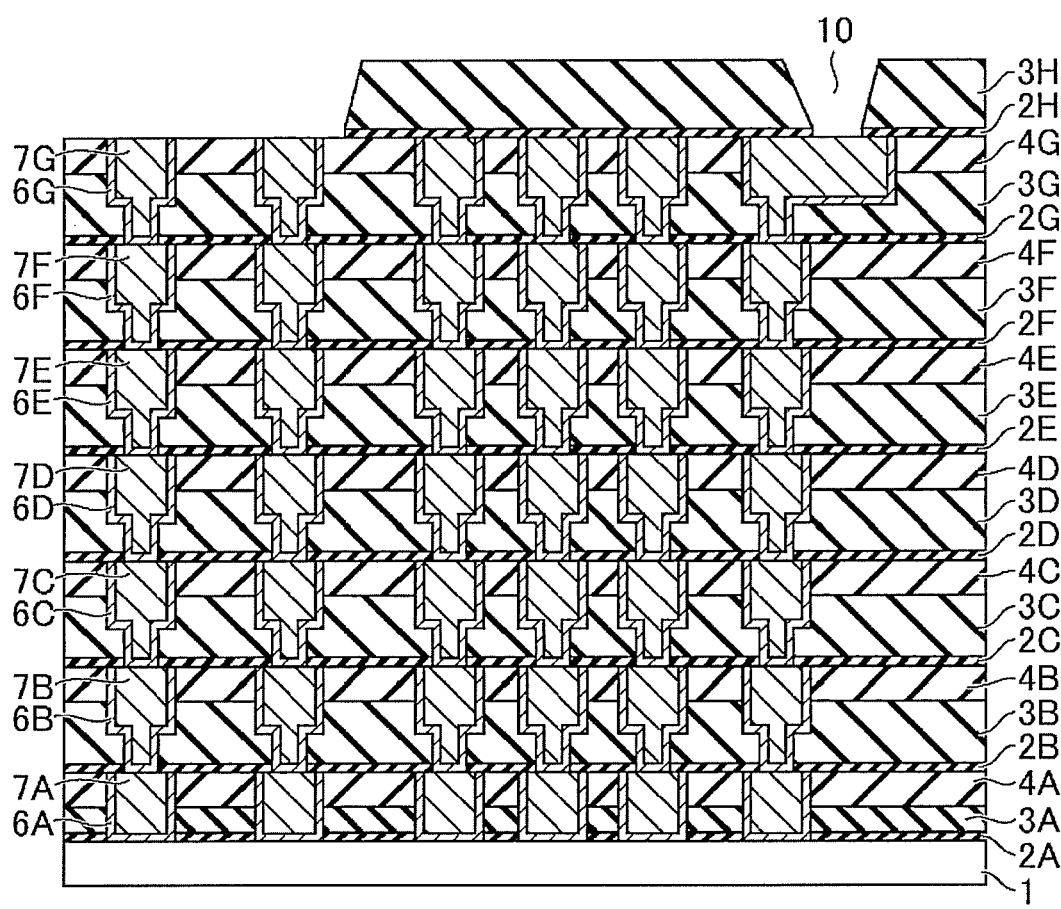
FIG. 8 is a schematic cross-sectional view illustrating the respective processes in the method of manufacturing the semiconductor device according to the embodiment.

Then, as illustrated in FIG. 8, an insulating film 2H having a thickness of about 10 nm, which is formed of, for example, a silicon carbonitride film (SiCN film), is deposited over the copper wiring (seventh layer wiring) 7G and the insulating film 4G. Then, an insulating film 3H having a thickness of 100 nm, which is formed of, for example, a silicon oxide film (SiO$_2$ film), is deposited over the insulating film 2H. Subsequently, after an organic antireflection film (not shown) has been coated on a surface of the insulating film 3H, a resist mask (not shown) having a hole pattern is formed over the organic antireflection film through the photolithography. Then, the insulating films 3H and 4H are partially etched with the use of the resist mask through the dry etching method. As a result, a via hole 10 is formed. Thereafter, the resist mask and the organic antireflection film are removed by ashing.

Figure 9:
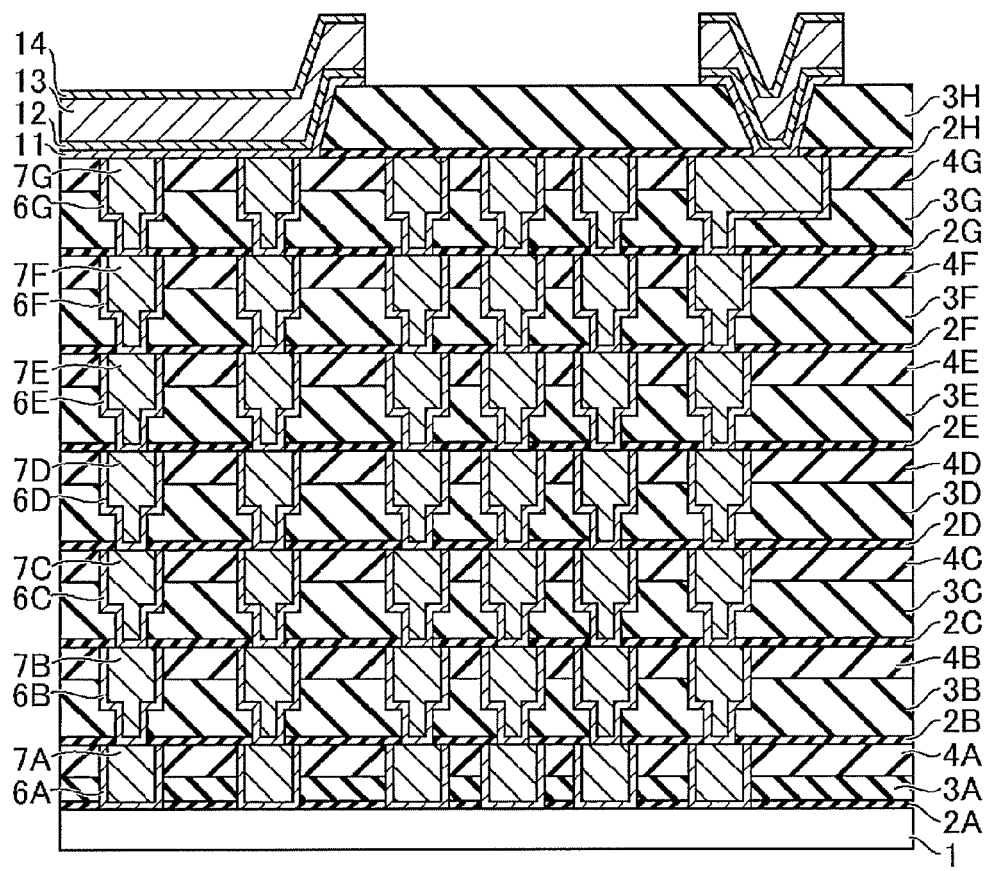
FIG. 9 is a schematic cross-sectional view illustrating the respective processes in the method of manufacturing the semiconductor device according to the embodiment.

Then, as illustrated in FIG. 9, for example, a composite film comprising a titanium film (Ti film) 11, a first titanium nitride film (TiN film) 12, a copper added aluminum film (AlCu film) 13, and a second titanium nitride film (TiN film) 14 are sequentially deposited over the insulating film 3H in which the via hole 10 is formed. Subsequently, after an organic antireflection film (not shown) has been coated on a surface of the second titanium nitride film 14, a resist mask (not shown) having a crack lead ring pattern and a pad pattern is formed over the organic antireflection film through photolithography. Then, the composite film (i.e., titanium film 11, the first titanium nitride film 12, the copper added aluminum film 13, and the second titanium nitride film 14) is partially etched with the use of the resist mask through the dry etching method. As a result, the first titanium film 11, the titanium nitride film 12, and the copper added aluminum film 13 coated with the second titanium nitride film 14, which constitute the upper wiring 65 (the crack lead ring 56) and the pads 54 are formed. Thereafter, the resist mask and the organic antireflection film are removed by ashing.

Figure 10:
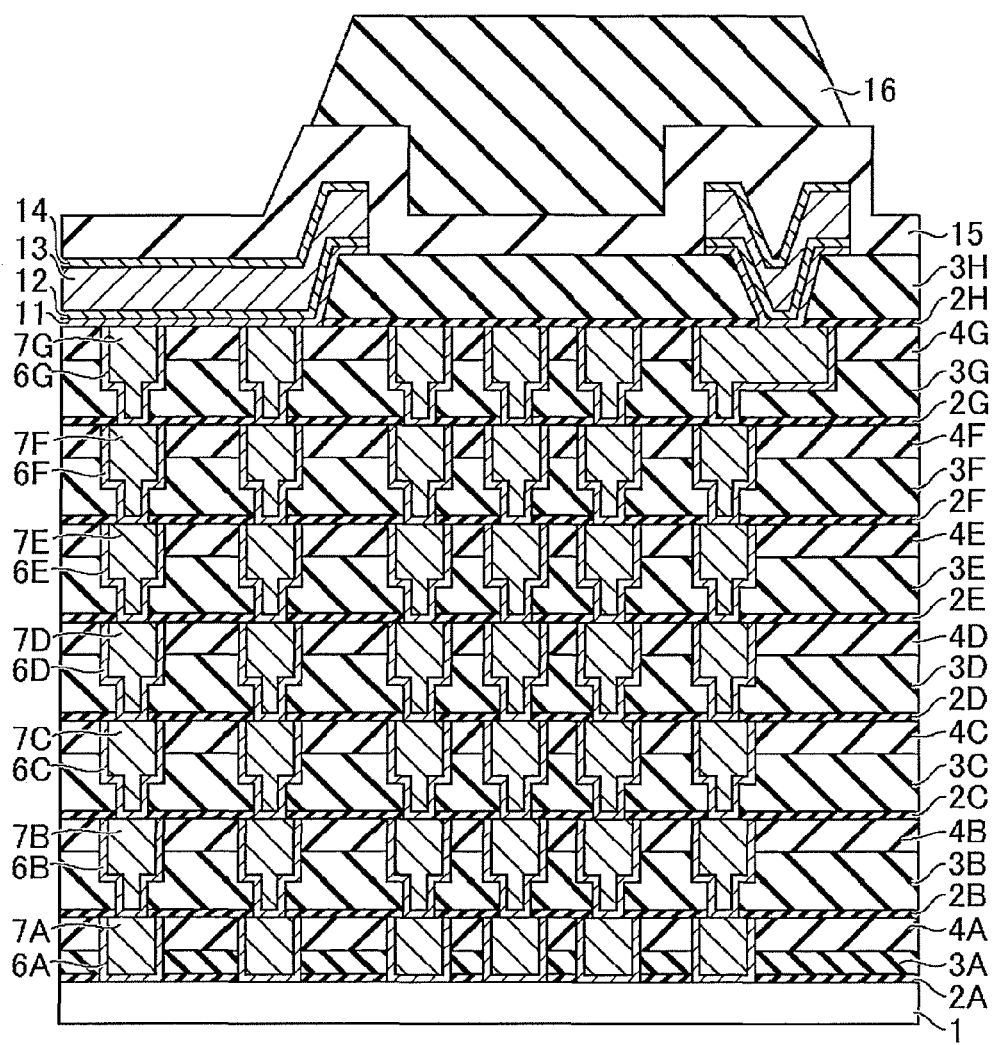
FIG. 10 is a schematic cross-sectional view illustrating the respective processes in the method of manufacturing the semiconductor device according to the embodiment.

Subsequently, as illustrated in FIG. 10, an insulating film 15 having a thickness of about 100 nm, which is formed of, for example, a silicon oxynitride film (SiON film), is deposited over the second nitride film 14 and the insulating film 3H. Then, a heat resistant protective film 16 having a thickness of 700 nm, which is made of photosensitive polyimide, is deposited over the insulating film 15. Then, a resist mask (not shown) having the pads 54 and the scribe line region 59 is formed through the photolithography. The heat resistant protective film 16 is partially etched with the resist mask through the etching technique.

Figure 11:
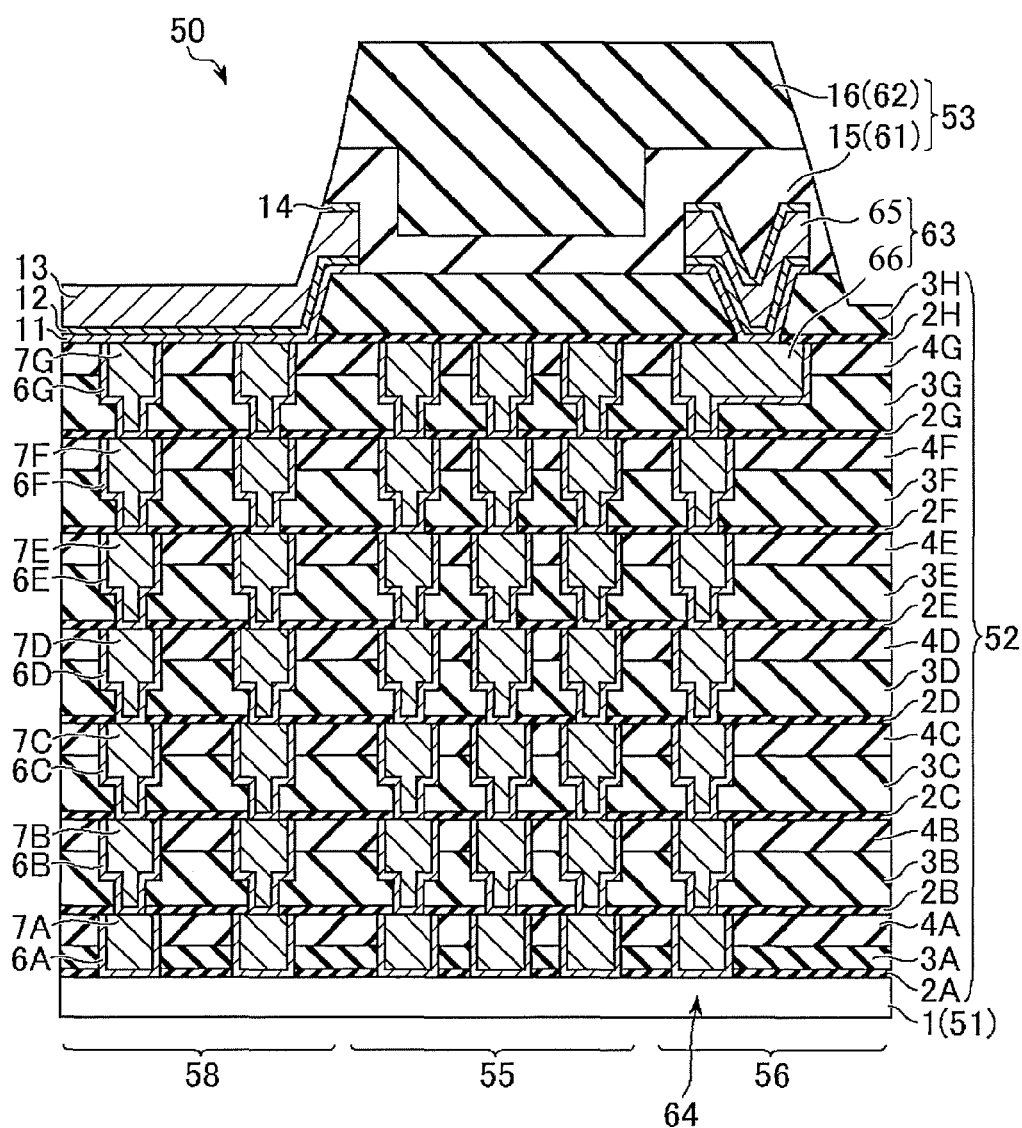
FIG. 11 is a schematic cross-sectional view illustrating the respective processes in the method of manufacturing the semiconductor device according to the embodiment.

Further, as illustrated in FIG. 11, the insulating film 15 is partially etched with the use of the resist mask or the etched heat resistant protective film 16 through the etching technique. As a result, openings of the pads 54 and the scribe line region 59 are formed in the insulating film 15 and the heat resistant protective film 16.

Through the above respective processes, the semiconductor device according to this embodiment is manufactured.

A correspondence relationship between a structure of FIG. 1B and a structure of FIG. 11 is illustrated in FIG. 11. Specifically, the semiconductor substrate 51 corresponds to the silicon substrate 1. The interlayer insulating layer 52 corresponds to the insulating films 2A to 4A/ . . . /2G to 4G. The wirings of the plurality of wiring layers correspond to the multilayer film 6A, the copper wiring 7A/ . . . /the multilayer film 6G, the copper wiring 7G. The passivation film 61 of the protective film 53 corresponds to the insulating film 15, and the heat resistant protective film 62 corresponds to the heat resistant protective film 16. The seal rings 55 correspond to the multilayer film 6A, the copper film 7A/ . . . /the multilayer film 6G, the copper wiring 7G in a region indicated by "55" in FIG. 11. The guard ring 64 of the crack lead ring 56 corresponds to the multilayer film 6A, the copper film 7A/ . . . /the multilayer film 6F, and the copper wiring 7F in a region indicated by "56" in FIG. 11. The lower wiring 66 corresponds to the multilayer film 6G and the copper wiring 7G in a region indicated by "56" in FIG. 11. The upper wiring 65 corresponds to the upper wiring 13 indicated by "56" in FIG. 11.

In a large number of semiconductor devices 50 employing the structure of this embodiment, a crack suppression effect has been examined. Specifically, in each of the semiconductor devices 50, the number of cracks 90 that go through the crack lead ring 56, and enter the circuit region 58 is examined by visual inspection (e.g. an electron microscope observation).

Figure 12:
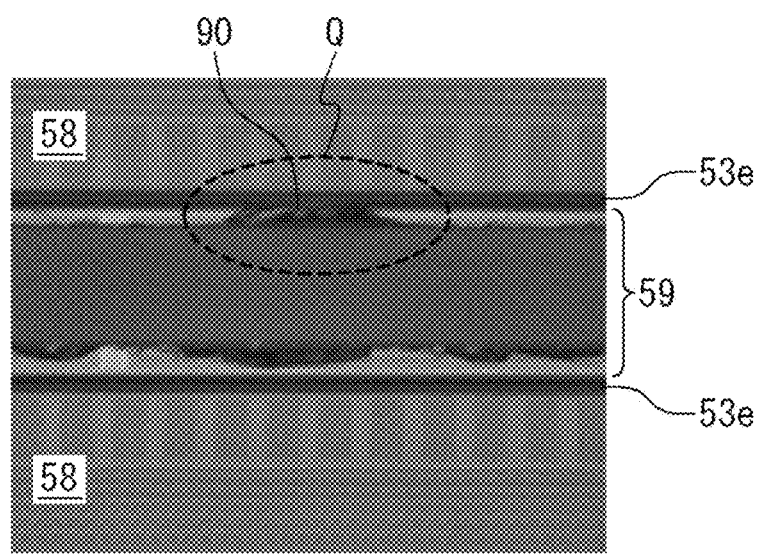
FIG. 12 is a plan photograph showing one of observation results of the semiconductor device employing a structure of the embodiment by an electron microscope.
Figure 13:
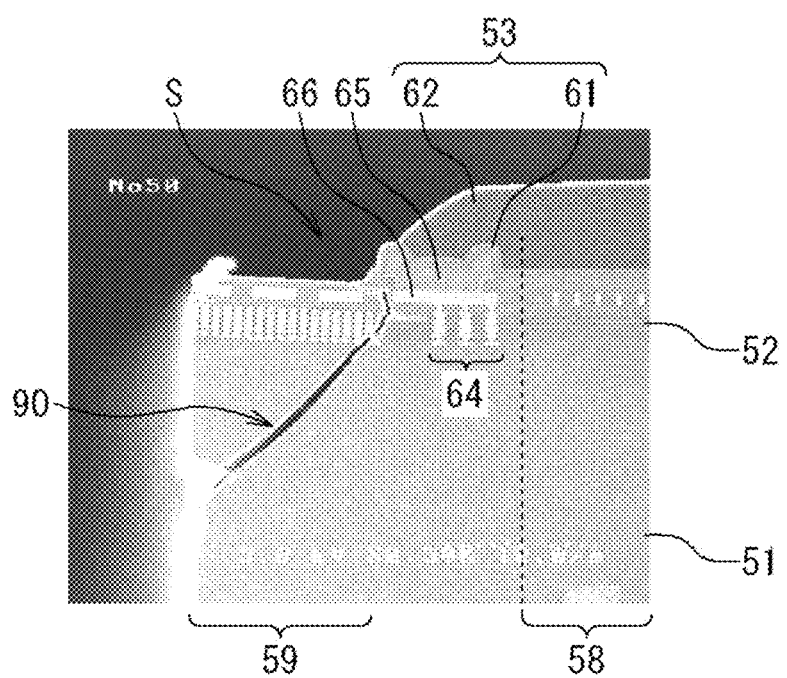
FIG. 13 is a plan photograph showing another of observation results of the semiconductor device employing a structure of the embodiment by an electron microscope.

FIGS. 12 and 13 are a plan photograph and a cross-sectional photograph illustrating an example of observation results of the semiconductor device 50 employing the structure of this embodiment by the electron microscope, respectively. As illustrated in FIG. 12, in a region Q indicated by a dashed line, the crack 90 is generated in the scribe line region 59 extending between the circuit regions 58 of two semiconductor chips, and extends towards one of the circuit regions 58. However, the crack 90 stops in the vicinity of the end 53e of the protective film 53. In this location, as illustrated in FIG. 13, the crack 90 is led to the vicinity of the step S of the protective film 53 over the interlayer insulating layer 52. More specifically, the crack 90 proceeds from a cut surface of dicing, diagonally in a upward and rightward direction in the semiconductor substrate 51 and the interlayer insulating layer 52, and reaches the vicinity of the step S. However, the crack 90 does not spread to the circuit region 58 side from the crack lead rings (64, 65, 66). Thus, the semiconductor device 50 has the effect of preventing the crack 90 from spreading into the circuit region 58.

The results of examining the crack suppression effect as described above in a large number of semiconductor devices, will be described below. In the semiconductor device having the conventional structure, the percent of defects caused by dicing is about 14%. On the other hand, in the case of the semiconductor device 50 having the structure of this embodiment, the percent of defects caused by the dicing is lower than 2%. That is, it can be confirmed that the semiconductor device 50 employing the structure of this embodiment has an extremely excellent crack suppression effect.

Thus, according to this embodiment, in the semiconductor device, the crack caused by the mechanical stress at the time of dicing can be prevented from spreading into the circuit region with a high probability.

First Modification

A description will be given of a first modification of a semiconductor device and a method of manufacturing the semiconductor device according to this embodiment.

Figure 14:
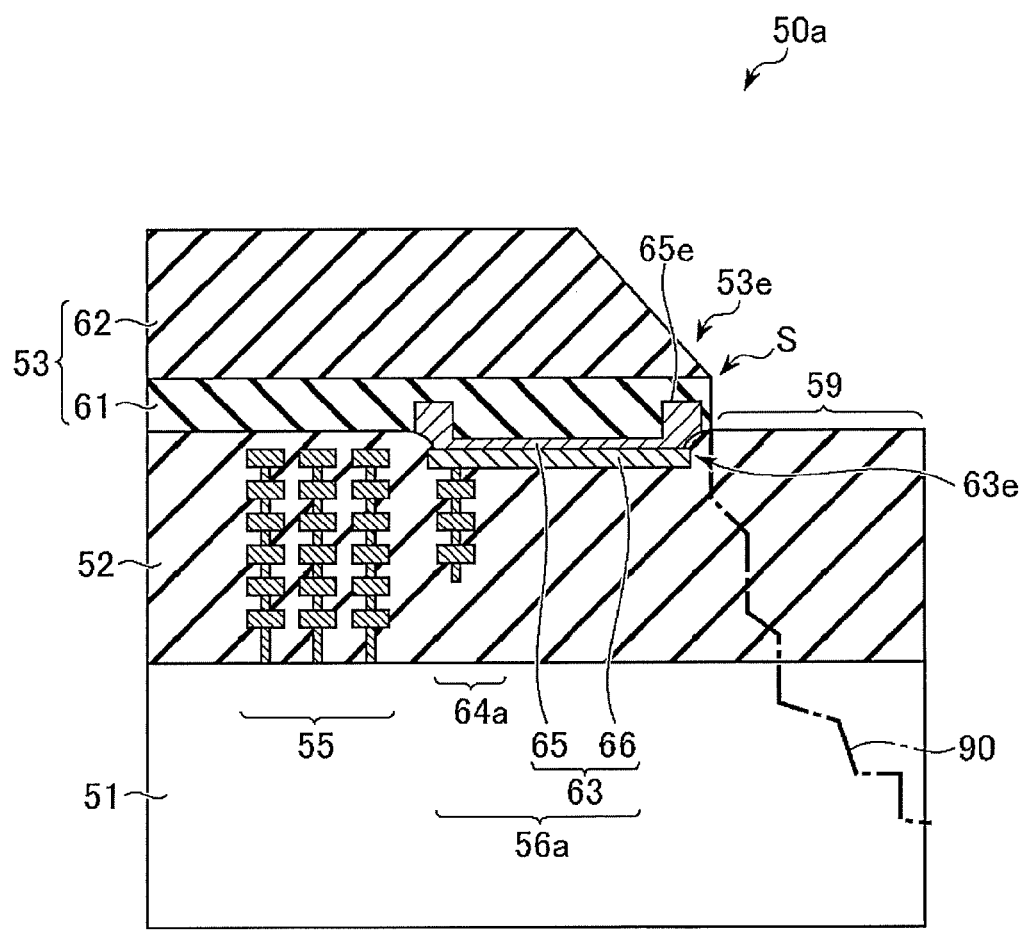
FIG. 14 is a schematic cross-sectional view illustrating a configuration of a semiconductor device according to a first modification of the embodiment.

FIG. 14 is a schematically cross-sectional view illustrating a configuration of the semiconductor device according to the first modification of this embodiment. A semiconductor device 50a according to this modification is different from the semiconductor device 50 in FIG. 1B in that an guard ring 64a extends from the lower wiring 66 to a middle of the interlayer insulating layer 52, but does not reach the semiconductor substrate 51. Hereinafter, the difference will be mainly described.

A crack lead ring 56a includes the uppermost layer wiring 63 and a guard ring 64a. The guard ring 64a extends from a portion immediately below the lower wiring 66 to the middle of the interlayer insulating layer 52, but does not reach the semiconductor substrate 51. Taking into account that the crack 90 is led to the step S, the spread of the crack in the guard ring 64a may be stopped on at least an upper portion of the interlayer insulating layer 52. This configuration can be realized by the following modification in the manufacturing processes of FIGS. 3 to 11. Specifically, the via hole of the guard ring 64a, the via holes 8 for the wirings (copper wirings), and the wiring grooves 9 are not formed in the middle (in an example, 2C to 4C) of the insulating films 2A to 4A/ . . . . The wiring (copper wiring) of the guard ring 64a, the wiring grooves 9 for the via holes, and the via holes 8 are formed from this middle (in an example, 2D to 4D) to the insulating films 2F to 4F.

Also, in this modification, the same advantages as those in the semiconductor device 50 in FIG. 1B can be obtained.

Also, the structure can be simplified since the guard ring 64a is not present at a side close to the semiconductor substrate 51.

Second Modification

A description will be given of a second modification of a semiconductor device and a method of manufacturing the semiconductor device according to this embodiment.

Figure 15:
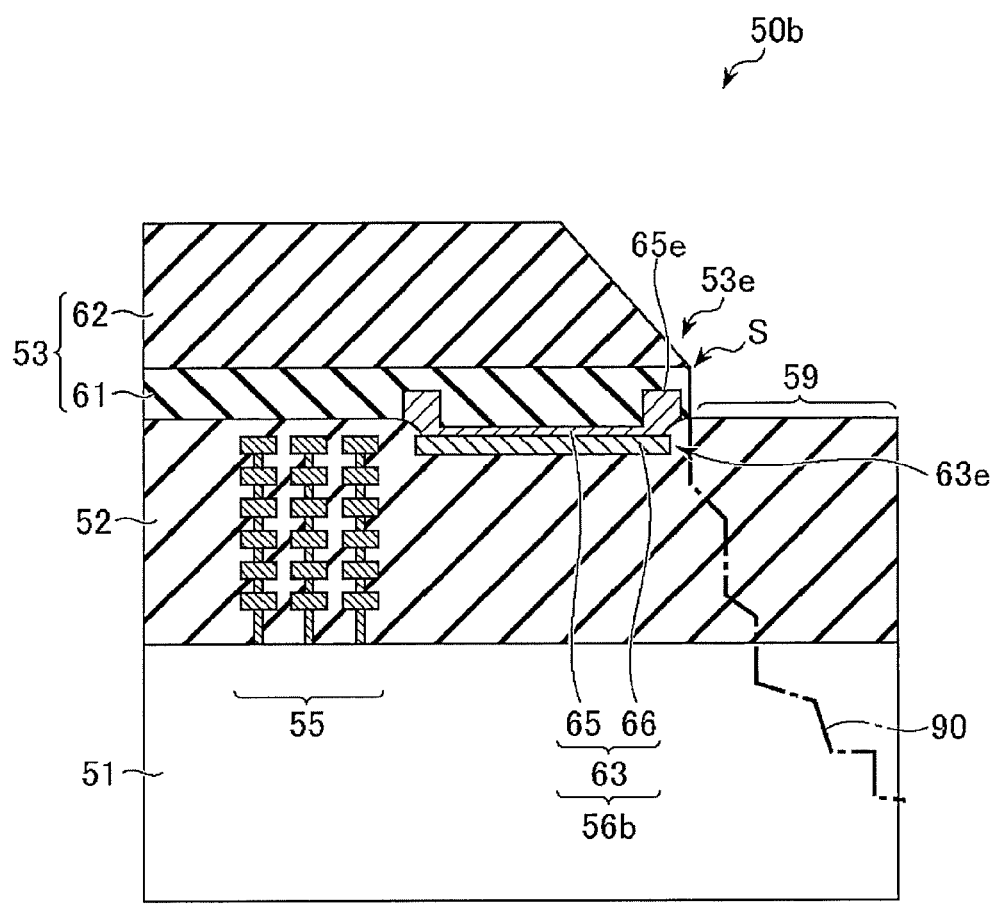
FIG. 15 is a schematic cross-sectional view illustrating a configuration of a semiconductor device according to a second modification of the embodiment.

FIG. 15 is a schematically cross-sectional view illustrating a configuration of the semiconductor device according to the second modification of this embodiment. A semiconductor device 50b according to this modification is different from the semiconductor device 50 in FIG. 1B in that no guard ring 64 is provided. Hereinafter, the difference will be mainly described.

A crack lead ring 56b includes the uppermost layer wiring 63. However, no guard ring 64 is provided. In this case, the seal rings 55 perform the function of the guard ring 64a. The number of seal rings 55 may be increased. This configuration can be realized without formation of the following structures for the guard ring 64: via holes such as the via holes 8 for the wirings (coppering wirings), and the wiring grooves 9 in the insulating films 2A to 4A/ . . . /2F to 4F in the manufacturing processes of FIGS. 3 to 11.

Further, the upper wiring 65 of the uppermost layer wiring 63 may be provided with no protrusion 65e of the sort seen in FIG. 1B. This configuration can be realized by further flattening the upper wiring 65 through the CMP technique after forming the upper wiring 65 in the manufacturing processes of FIGS. 3 to 11.

Also, in this modification, the same advantages as those in the semiconductor device 50 in FIG. 1B can be obtained. Also, the structure can be simplified since no guard ring 64 is provided.

Third Modification

A description will be given of a third modification of a semiconductor device and a method of manufacturing the semiconductor device according to this embodiment.

Figure 16:
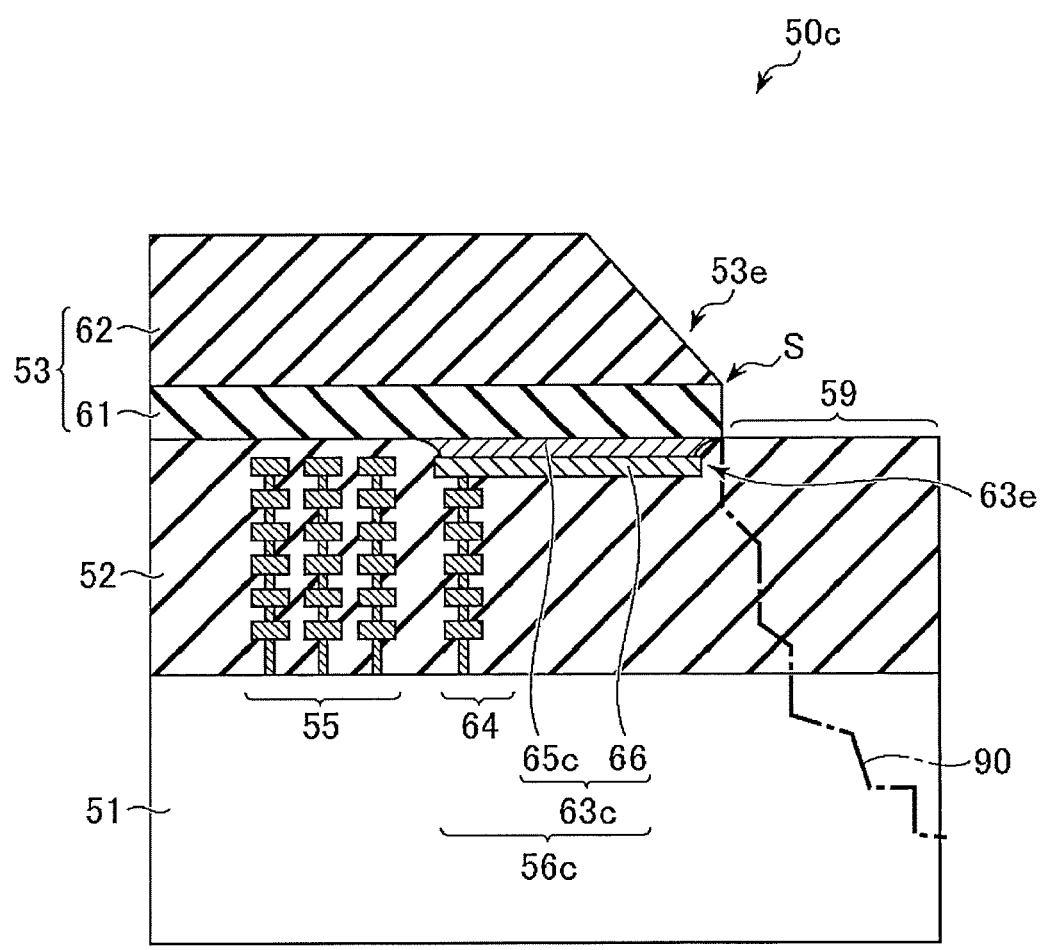
FIG. 16 is a schematic cross-sectional view illustrating a configuration of a semiconductor device according to a third modification of the embodiment.

FIG. 16 is a schematically cross-sectional view illustrating a configuration of the semiconductor device according to the third modification of this embodiment. A semiconductor device 50c according to this modification is different from the semiconductor device 50 of FIG. 1B in that an upper wiring 65c of an uppermost layer wiring 63c has no protrusion. Hereinafter, the difference will be mainly described.

The crack lead ring 56c includes the uppermost layer wiring 63c and the guard ring 64. The uppermost layer wiring 63c includes the lower wiring 66 and the upper wiring 65c disposed over the lower wiring 66. The upper wiring 65c has an upper surface exposed to the surface of the interlayer insulating layer 52, and substantially flush with the surface of the interlayer insulating layer 52. However, the upper wiring 65c has no protrusion which is an end protruded upward from the upper surface of the interlayer insulating layer 52. This configuration can be realized by flattening the upper wiring 65c through the CMP technique after forming the upper wiring 65c in the manufacturing process of FIGS. 3 to 11.

Also, in this modification, the same advantages as those in the semiconductor device 50 of FIG. 1B can be obtained. Also, a coatability of the protective film 53 on the end can be enhanced since no protrusion is provided.

Fourth Modification

A description will be given of a fourth modification of a semiconductor device and a method of manufacturing the semiconductor device according to this embodiment.

Figure 17:
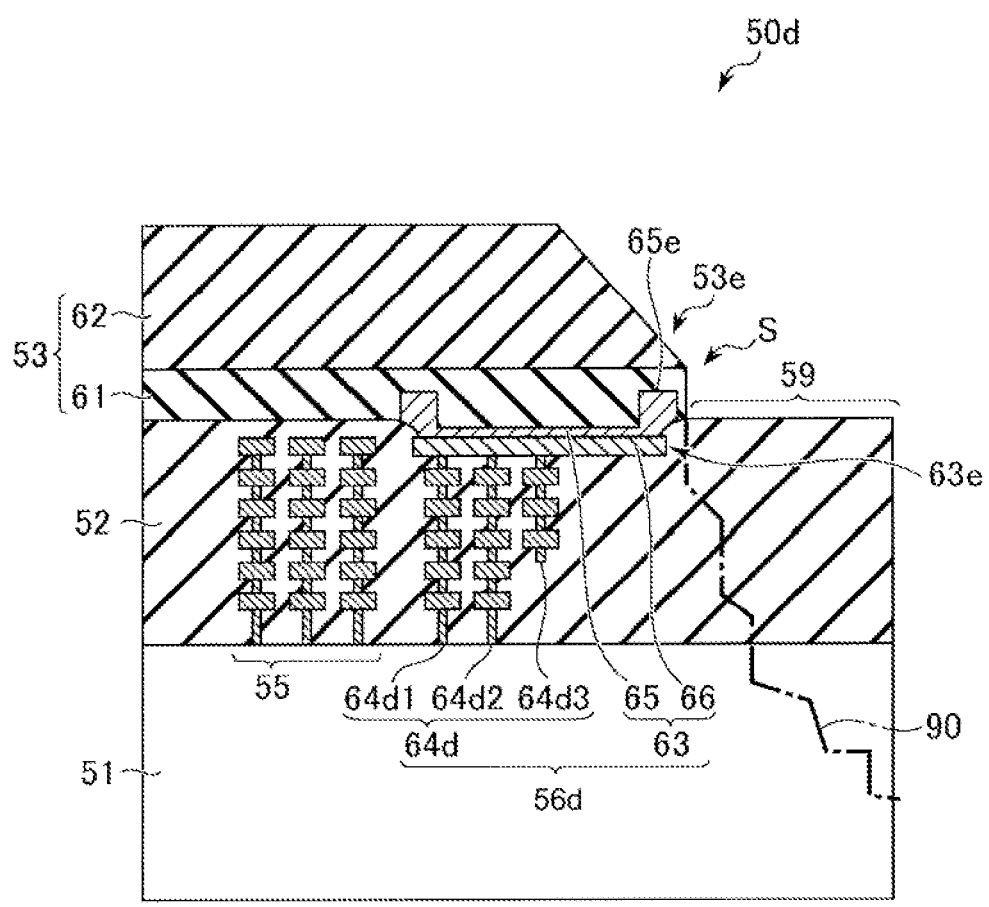
FIG. 17 is a schematic cross-sectional view illustrating a configuration of a semiconductor device according to a fourth modification of the embodiment.

FIG. 17 is a schematically cross-sectional view illustrating a configuration of the semiconductor device according to the fourth modification of this embodiment. A semiconductor device 50d according to this modification is different from the semiconductor device 50 of FIG. 1B in that a plurality of guard rings 64d are disposed outside the seal rings 55. Hereinafter, the difference will be mainly described.

A crack lead ring 56d includes the uppermost layer wiring 63 and guard rings 64d. The plurality of guard rings 64d are disposed toward the outside from the seal rings 55 side. In other words, the guard rings 64d surround the circuit region 58 already surrounded by the seal rings 55. In the example of this drawing, three guard rings 64d1, 64d2, and 64d3 are disposed outside the seal rings 55 in the stated order. This configuration can be realized by forming the via holes of the plurality of guard rings 64d, the via holes 8 for the wirings (copper wirings), and the wiring grooves 9 in the manufacturing processes of FIGS. 3 to 11.

Also, the outermost guard ring 64d3 among the plurality of guard rings 64d extends from a portion immediately below the lower wiring 66 to the middle of the interlayer insulating layer 52 as in the first modification. However, the outermost guard ring 64d3 may not reach the semiconductor substrate 51. This configuration can be realized by the manufacturing process described in the first modification.

Also, in this modification, the same advantages as those in the semiconductor device 50 of FIG. 1B can be obtained. Also, the spread of the cracks toward the circuit region 58 instead of toward the step S, can be more excellently prevented.

The techniques described in this embodiment and the first modification to the fourth modification can be applied to each other so far as no consistency occurs.

As described above, according to the embodiment, in the semiconductor device, the crack caused by the mechanical stress at the time of dicing can be prevented from spreading into the circuit region.

The invention made by the present inventors has been described specifically on the basis of the embodiments. However, the present invention is not limited to the above embodiments, and so various changes can be made without departing from the spirit of the present invention.

What is claimed is:

1. A semiconductor device, comprising:
a semiconductor substrate;
an interlayer insulating layer disposed over the semiconductor substrate and including a plurality of wiring layers;
a scribe line region located over a portion of the interlayer insulating layer,
a seal ring disposed in the interlayer insulating layer, and surrounding a circuit region of the semiconductor substrate;
a crack lead ring disposed in the interlayer insulating layer, and surrounding the seal ring; and
a protective film disposed over the interlayer insulating layer and covering the crack lead ring and the seal ring, but not covering the scribe line region,
wherein the crack lead ring includes an uppermost layer wiring in an uppermost wiring layer of said plurality of wiring layers,
wherein when the crack lead ring has a wiring in an underlayer below the uppermost wiring layer, the uppermost layer wiring extends in a direction away from the circuit region towards an outside of the semiconductor device, relative to the wiring in the underlayer, and
wherein the protective film has an end overlapped with an end of the uppermost layer wiring nearest the scribe line region, the end of the protective film not overlapping the scribe line region, and wherein the protective film forms a step over the interlayer insulating layer, at an edge of the scribe line region.

2. The semiconductor device according to claim 1, wherein the crack lead ring further comprises:
a guard ring as said wiring of the underlayer, continuously formed over one or more wiring layers connected by via holes, from the uppermost wiring layer toward the semiconductor substrate.

3. The semiconductor device according to claim 2, wherein the uppermost layer wiring extends farther toward the outside, as compared with the guard ring.

4. The semiconductor device according to claim 3, wherein a width of the uppermost layer wiring is twice as broad as a width of the guard ring.

5. The semiconductor device according to claim 2, wherein the guard ring reaches the semiconductor substrate from the uppermost wiring layer.

6. The semiconductor device according to claim 2, wherein a plurality of guard rings are disposed from the seal ring side toward the outside.

7. The semiconductor device according to claim 1, wherein the uppermost layer wiring includes:
a lower wiring; and
an upper wiring disposed over the lower wiring, and
wherein an end of the upper wiring includes a protrusion protruded upward from an uppermost surface of the interlayer insulating layer.

8. The semiconductor device according to claim 1, wherein the protective film includes:
a passivation film disposed to cover the crack lead ring and the seal ring; and
a heat resistant film disposed to cover the passivation film,
wherein ends of the passivation film and the heat resistant film overlap with an end of the uppermost layer wiring.

9. The semiconductor device according to claim 1, wherein a plurality of seal rings are disposed outward from the circuit region side, and
wherein a distance between a first seal ring adjacent to the crack lead ring and the crack lead ring, is larger than a distance from the first seal ring to an adjacent second seal ring.

10. The semiconductor device according to claim 1, wherein the crack lead ring further includes:
a guard ring as said wiring of the underlayer, continuously formed over one or more wiring layers from the uppermost wiring layer toward the semiconductor substrate through a via hole,
wherein the uppermost layer wiring includes:
a lower wiring; and
an upper wiring disposed over the lower wiring,
wherein an end of the upper wiring includes a protrusion protruded upward from an uppermost surface of the interlayer insulating layer,
wherein the protective film includes:
a passivation film disposed to cover the crack lead ring and the seal ring; and a heat resistant film disposed to cover the passivation film, and wherein ends of the passivation film and the heat resistant film overlap with the protrusion.

11. A method for manufacturing a semiconductor device, comprising the steps of:
forming, over a semiconductor substrate, an interlayer insulating layer including a plurality of wiring layers, a seal ring surrounding a circuit region over the semiconductor substrate, and a crack lead ring having an uppermost layer wiring in an uppermost wiring layer of the plurality of wiring layers; and
forming, over the interlayer insulating layer, a protective film covering the uppermost layer wiring and the seal ring,
wherein when the crack lead ring has a wiring in an underlayer below the uppermost wiring layer, the uppermost layer wiring extends in a direction away from the circuit region towards a scribe line region at an outside of the semiconductor device, relative to the wiring in the underlayer, and
wherein the step of forming the protective film includes:
a step of forming the protective film so that:
an end of the protective film overlaps an end of the uppermost layer wiring nearest the scribe line region, the end of the protective film not overlapping the scribe line region, and wherein the protective film forms a step over the interlayer insulating layer, at an edge of the scribe line region.

12. A semiconductor device, comprising:
a semiconductor substrate;
an interlayer insulating layer disposed over the semiconductor substrate and including a plurality of wiring layers, the plurality of wiring layers including an uppermost wiring layer;
a scribe line region located over a portion of the interlayer insulating layer;
a seal ring disposed in the interlayer insulating layer, and surrounding a circuit region of the semiconductor substrate;
a crack lead ring disposed in the interlayer insulating layer, and surrounding the seal ring, the crack lead ring including an uppermost layer wiring formed in the uppermost wiring layer, the uppermost layer wiring extending in a direction away from the circuit region towards the scribe line region and terminating in an end; and
a protective film disposed over the interlayer insulating layer, and covering the crack lead ring and the seal ring, the protective film overlapping the end of the uppermost layer wiring but not overlapping the scribe line region and thereby forming a step at an edge of the scribe line region.

13. The semiconductor device according to claim 12, wherein the crack lead ring further comprises:
a guard ring surrounding the seal ring, the guard ring being connected to the uppermost layer wiring and disposed closer to the seal ring than to an intermediate position, in a width direction, of the uppermost layer wiring.

14. The semiconductor device according to claim 13, wherein:
the guard ring comprises alternating wiring layers and via holes, and extends from the uppermost layer wiring toward the semiconductor substrate.

15. The semiconductor device according to claim 13, wherein the guard ring reaches the semiconductor substrate from the uppermost layer wiring.

16. The semiconductor device according to claim 13, wherein the guard ring does not reach the semiconductor substrate from the uppermost layer wiring.

17. The semiconductor device according to claim 13, comprising a plurality of concentric guard rings surrounding the seal ring, each guard ring connected to the uppermost layer wiring.

18. The semiconductor device according to claim 17, wherein:
at least one of said plurality of guard rings reaches semiconductor substrate from the uppermost layer wiring; and
at least one other of said plurality of guard rings does not reach the semiconductor substrate from the uppermost layer wiring.

19. The semiconductor device according to claim 12, comprising:
a plurality of seal rings located between the crack lead ring and the circuit region, each seal ring surrounding the circuit region and extending from the uppermost wiring layer to the semiconductor substrate;
wherein a first distance between a first seal ring adjacent to the crack lead ring and the crack lead ring, is larger than a second distance between the first seal ring and an adjacent second seal ring.

20. The semiconductor device according to claim 12, wherein:
the uppermost layer wiring includes a lower wiring and an upper wiring disposed over the lower wiring, and
an end of the upper wiring includes a protrusion protruded upward from an uppermost surface of the interlayer insulating layer.

21. The semiconductor device according to claim 12, wherein:
the protective film includes a passivation film disposed to cover the crack lead ring and the seal ring, and a heat resistant film disposed to cover the passivation film; and
ends of the passivation film and the heat resistant film overlap with an end of the uppermost layer wiring.

22. A method for manufacturing a semiconductor device having a crack-resistant ring structure, comprising the steps of:
forming, over a semiconductor substrate having a scribe line region, an interlayer insulating layer including a plurality of wiring layers including an uppermost wiring layer, a seal ring surrounding a circuit region over the semiconductor substrate, and a crack lead ring having an uppermost layer wiring formed in the uppermost wiring layer and extending in a direction away from the circuit region towards the scribe line region and terminating in an end; and
forming, over the interlayer insulating layer, a protective film covering the uppermost layer wiring and the seal ring, such that an end of the protective film overlaps the end of the uppermost layer wiring but does not overlap the scribe line region to thereby form a step over the interlayer insulating layer, at an edge of the scribe line region.

* * * * *